(12) United States Patent
Chiu et al.

(10) Patent No.: US 12,154,806 B2
(45) Date of Patent: Nov. 26, 2024

(54) SUBSTRATE CARRIER LATCHING STRUCTURE

(71) Applicant: GUDENG PRECISION INDUSTRIAL CO., LTD., New Taipei (TW)

(72) Inventors: Ming-Chien Chiu, New Taipei (TW); Yung-Chin Pan, New Taipei (TW); Wei-Chian Liu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 21 days.

(21) Appl. No.: 17/163,450

(22) Filed: Jan. 31, 2021

(65) Prior Publication Data
US 2022/0013391 A1 Jan. 13, 2022

(30) Foreign Application Priority Data

Jul. 7, 2020 (TW) .................................. 109122944

(51) Int. Cl.
H01L 21/673 (2006.01)
(52) U.S. Cl.
CPC .. H01L 21/67379 (2013.01); *H01L 21/67366* (2013.01)
(58) Field of Classification Search
CPC ..................... H01L 21/67379; H01L 21/67373
See application file for complete search history.

(56) References Cited

U.S. PATENT DOCUMENTS

| | | | | |
|---|---|---|---|---|
| 6,010,008 A * | 1/2000 | Nyseth | ............. | H01L 21/67373 206/711 |
| 6,736,268 B2 * | 5/2004 | Nyseth | ............. | H01L 21/67383 206/711 |
| 7,347,329 B2 * | 3/2008 | Burns | ............... | H01L 21/67383 220/759 |
| 7,357,257 B2 * | 4/2008 | Matsutori | ......... | H01L 21/67383 206/711 |
| 8,091,710 B2 * | 1/2012 | Hasegawa | ............. | B65D 55/14 206/754 |
| 9,312,157 B2 * | 4/2016 | Adams | ............. | H01L 21/67369 |
| 2004/0124118 A1 * | 7/2004 | Matsutori | ......... | H01L 21/67379 206/710 |
| 2010/0314797 A1 * | 12/2010 | Odashima | ......... | H01L 21/67383 264/278 |
| 2011/0005966 A1 * | 1/2011 | Chiu | ................ | H01L 21/67379 206/711 |
| 2012/0325707 A1 * | 12/2012 | Ogawa | ............. | H01L 21/67379 206/454 |

(Continued)

FOREIGN PATENT DOCUMENTS

KR 10-0507952 B1 11/2005
KR 10-0989781 B1 10/2010

*Primary Examiner* — Ernesto A Grano
*Assistant Examiner* — Symren K Sanghera

(57) ABSTRACT

The invention discloses a substrate carrier latching structure, which mainly comprises a top portion, a cover and a detachable module. The top portion is disposed on the enclosure of a substrate carrier, and the cover is connected to the top portion via a detachable module. As such, the excessive stress on the substrate carrier is avoided to maintain the integrity of substrates stored in the inner portion of the substrate carrier.

12 Claims, 5 Drawing Sheets

(56) References Cited

U.S. PATENT DOCUMENTS

2013/0248413 A1* 9/2013 Ku ................... H01L 21/67373
                                                          206/710
2018/0102269 A1* 4/2018 Liu ................... H01L 21/67379
2019/0189489 A1* 6/2019 Mimura ............ H01L 21/67379

* cited by examiner

SUBSTRATE CARRIER LATCHING STRUCTURE

TECHNICAL FIELD

The present invention relates to a kind of latching structure. Specifically, the latching structure is used in the substrate carrier.

BACKGROUND OF RELATED ARTS

On the basis of the increasing number of circuits functionalized on the substrate, in order to effectively control pollutants, such as particles or airborne molecular contamination (AMC), and avoid damaging the integrity of the circuit, normally, manufacturers use a substrate carrier to seal and load the substrates, and then use automated machinery, such as a robotic arm, to perform subsequent movement and transmission of the substrate carrier and its internal substrates between different factories to ensure the highly cleanliness of the substrate.

In order to improve the stability of the substrate carrier during transferring, so as to reduce the possibility of the loss of the original leak tightness state in substrate carrier due to unexpected violent shaking or container deformation, conventionally, a protruding gripping part is installed on the outer surface of the substrate carrier to prevent the robot arm from directly applying force onto the outer surface of the substrate carrier. Additionally, the contact design between the gripping part and the substrate carrier surface is used to increase the homogeneity of pressure distribution on the surface of the carrier and the stability of the combination between the gripping part and the surface of the substrate carrier.

Current semiconductor manufacturing plants follow Moore's Law and have significantly increased the number of processing large-size substrates. On the basis that the size of the substrate loaded is proportional to the weight of the substrate carriers, it is obvious that it will be more difficult to transport the large substrates between the plant areas. For example, the single-piece weight of current 12-inch substrate is 0.128 kg, and the weight of the upcoming 18-inch substrate is estimated to be about 0.33 kg per piece. At the same time, as the size of the substrate increases, it will be easier to break the substrate. Therefore, it is essential to develop a connection design between the gripping part and the surface of the substrate carrier to maintain the stability of the substrate carrier during transferring and handling procedure.

SUMMARY

In order to solve the problem of the prior arts that the overloaded substrate carrier lead to the loss of the original leak tightness state in substrate carrier, the present invention provides a substrate carrier latching structure comprising a top portion, a cover and a detachable module, wherein the top portion is disposed on an enclosure; the cover is connected to the top portion via the detachable module. Wherein, the detachable module further comprises at least one first fastener, at least one second fastener, a positioning post and an alignment member. The at least one first fastener is configured on the top portion or the cover, and the at least one second fastener is configured on the top portion or the cover. The positioning post is configured on the top portion or the cover, and the alignment member is configured on the top portion or the cover corresponding to the positioning post. Furthermore, a shield is disposed on a horizontal extension part of the at least one first fastener, wherein the shield holds the at least one second fastener in a position as the at least one second fastener matches with the at least one first fastener. Wherein, the positioning post matches with the alignment member.

The enclosure refers to the part of substrate carriers for accommodating substrates. Wherein, substrate carriers may be defined by but not limited to SMIF Cassette, Front Opening Universal Pod (FOUP), Mask Package Pod, Reticle SMIF Pod (RSP), EUV Pod or any other containers. The materials of the components of the top portion, the cover, and the detachable module are selected from Cycloolefin copolymer (COC) adding carbon nanotubes, Cycloolefin polymer (COP) adding carbon nanotubes, Cyclic Block Copolymer (CBC) and other organic chemicals or the combination thereof, depending on the purpose of use.

As the cover connects with the top portion, the second fastener is matched with the at least one first fastener. The positioning post matches with the alignment member to form a plurality of connection points within the cover and the top portion. The plurality of connection points distributes the force on the cover. Therefore, the present invention applies to the transferring of substrate carriers to increase the stability during transferring.

Embodiments of the invention are illustrated by way of example, and not by way of limitation, in the figures of the accompanying drawings in which like reference numerals refer to similar elements.

DETAILED DESCRIPTION OF THE INVENTION

In order to understand the technical features and practical efficacy of the present invention and to implement it in accordance with the contents of the specification, hereinafter, preferred embodiments of the present invention will be described in detail with reference to the accompanying drawings.

Figure 1:
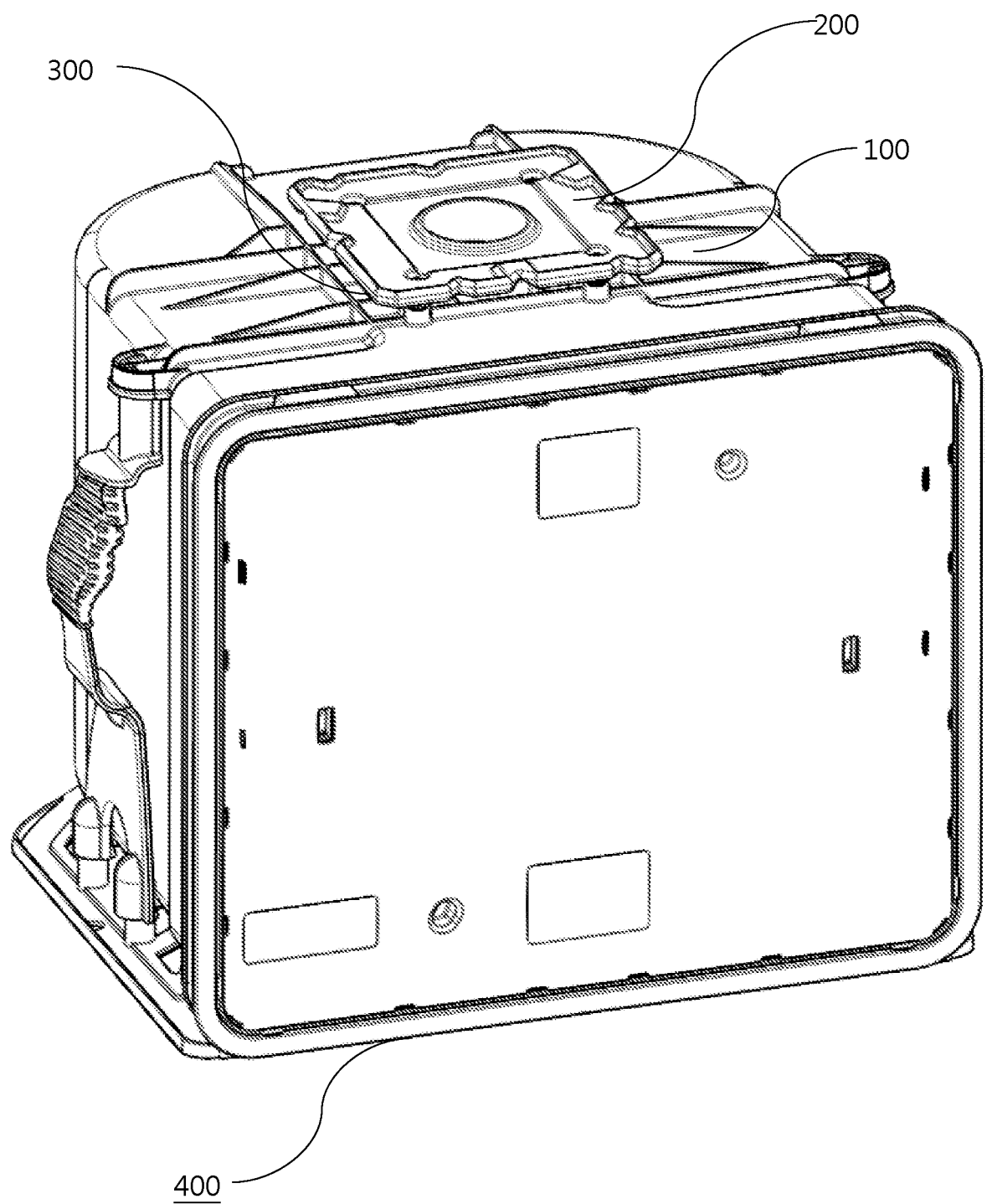
FIG. 1 illustrates a perspective view of a substrate carrier of an embodiment of the present invention.

Please refer to FIG. 1. FIG. 1 is a perspective view of a substrate carrier of an embodiment of the present invention. In the embodiment, substrate carrier latching structure 10 mainly comprises a cover 100, a cover 200 and a detachable module 300. Wherein, the top portion 100 is disposed on the side of an enclosure 400. The top portion 100 provides the base for connected to the cover via the detachable module 300.

In order to implement the embodiment, said substrate carriers include containers accommodating any other chips-like semiconductors, such as wafers and reticles. In other words, substrate carriers refer to SMIF Cassette, Front Opening Universal Pod (FOUP), Mask Package Pod, Reticle SMIF Pod (RSP), EUV Pod or other containers, and it is not intended to be exhaustive or to be limited to the precise forms disclosed. In the embodiment, the materials of the top portion 100, the cover 200 and the detachable module 300 are possibly selected from the organic chemicals group comprising Cycloolefin copolymer (COC) adding carbon nanotubes, Cycloolefin polymer (COP) adding carbon nanotubes, Cyclic Block Copolymer (CBC) or the combination thereof, or otherwise selected from the styrenic polymers group comprising Polybutylene terephthalate (PBT), the polyester compounds of PBT, Polystyrene (PS), High-impact polystyrene (HIPS), Acrylonitrile Butadiene Styrene (ABS), acrylonitrile-styrene copolymer (AS) or the combination thereof, and it is not intended to be exhaustive or to be limited to the precise forms disclosed.

Figure 2:
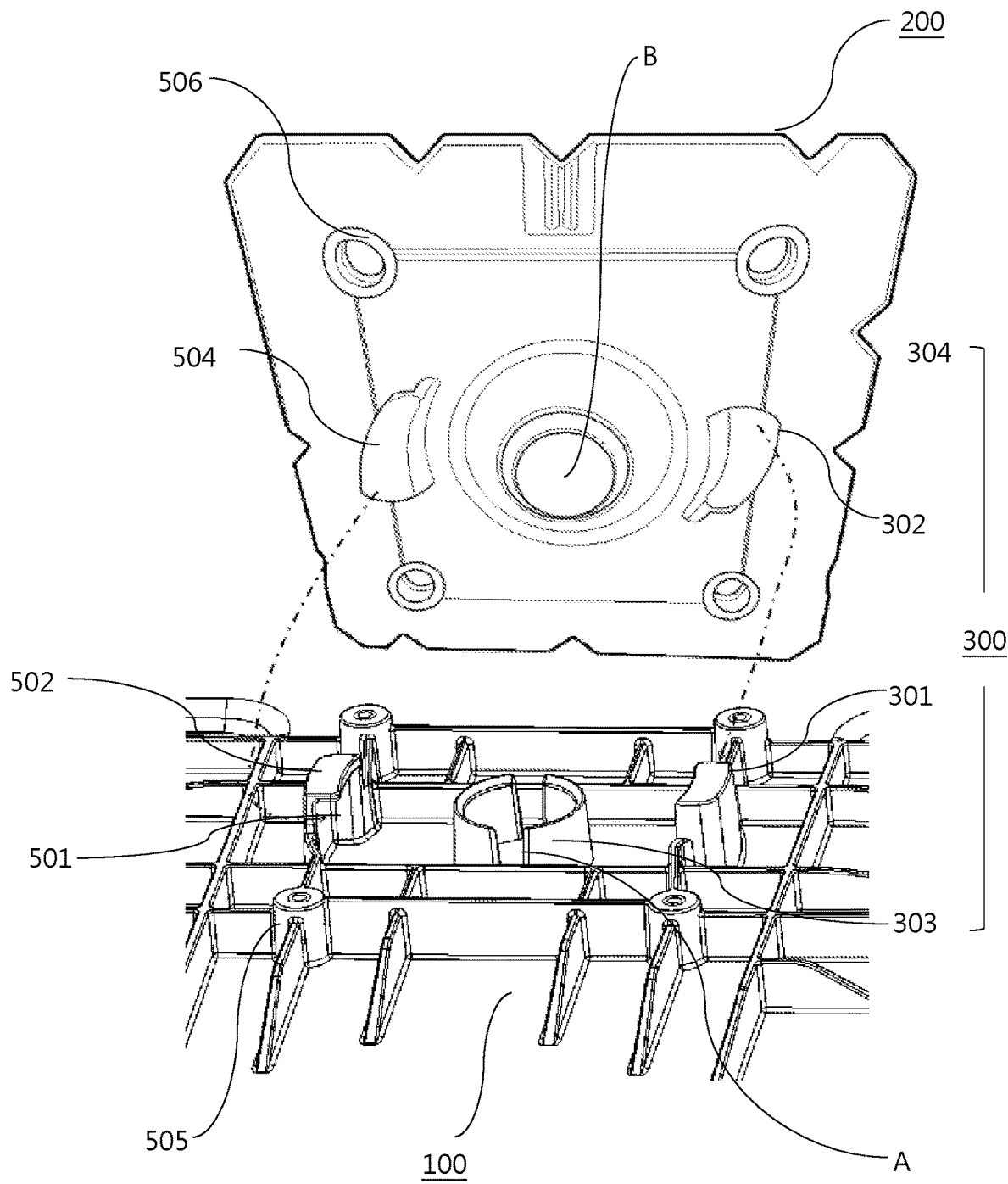
FIG. 2 illustrates a perspective view of the detachable module of the embodiment of the present invention.

Please refer to FIG. 1 and FIG. 2, FIG. 2 is a perspective view of the detachable module of the embodiment of the substrate carrier latching structure 10. In the embodiment, the detachable module 300 includes at least one first fastener 301, at least one second fastener 302, a positioning post 303 and an alignment member 304. In order to understand the following description, the present embodiment defines the side of the top portion 100 facing the cover 200 as the first surface, and defines the side of the cover 200 facing the first surface as the second surface. As FIG. 2 shown, the first fastener 301 and the positioning post 303 are configured on said first surface, and the second fastener 302 and the alignment member 304 are configured on said second surface. When the cover 200 is matching with the top portion 100, move the second surface toward the first surface and align the second fasteners 302 with the first fasteners 301 one by one. Then, match the alignment member 304 with the corresponding positioning post 303 to combine the cover 200 with the top portion 100.

In FIG. 2, the first surface includes a first center A and the second surface includes a second center B. The first fasteners 301 are installed at the equal distance from the first center A, and the second fasteners 302 are installed around the second center B at the equal distance. Same as the second fasteners 302, the first fasteners 301 are arranged in ring-shaped. As shown in FIG. 2, the positioning post 303 is installed at the first center A. The alignment member 304 is installed at the second center B. Further, the positioning post 303 of the present embodiment consists of two semicircle arcs, wherein every two of the arcs are not in contact and are aligned and centered with the first center A. Additionally, the alignment member 304 is designed as a funnel shape and is connected to the second surface of the cover 200 through the biggest caliber of the alignment member 304.

In the embodiment, the detachable module 300 further includes several first latch portions 505 and several second latch portions 506. The first latch portions 505 protrudes from the first surface and the second latch portions 506 protrudes from the second surface corresponding with the first latch portions 505. With the above structure, the second latch portions 506 are able to match with the first latch portions 505 in order to fix well. Specifically, the second latch portions 506 connect with the first latch portions 505 by several screwing members, such as screws and bolts. Moreover, in the present embodiment, the number of the first latch portions 505 and the second latch portions 506 is four respectively (As shown in FIG. 2), while in the other embodiments, the number of the first latch portions 505 and the second latch portions 506 may be one or more than one respectively, and it is not intended to be limited to the precise forms disclosed.

Figure 3:
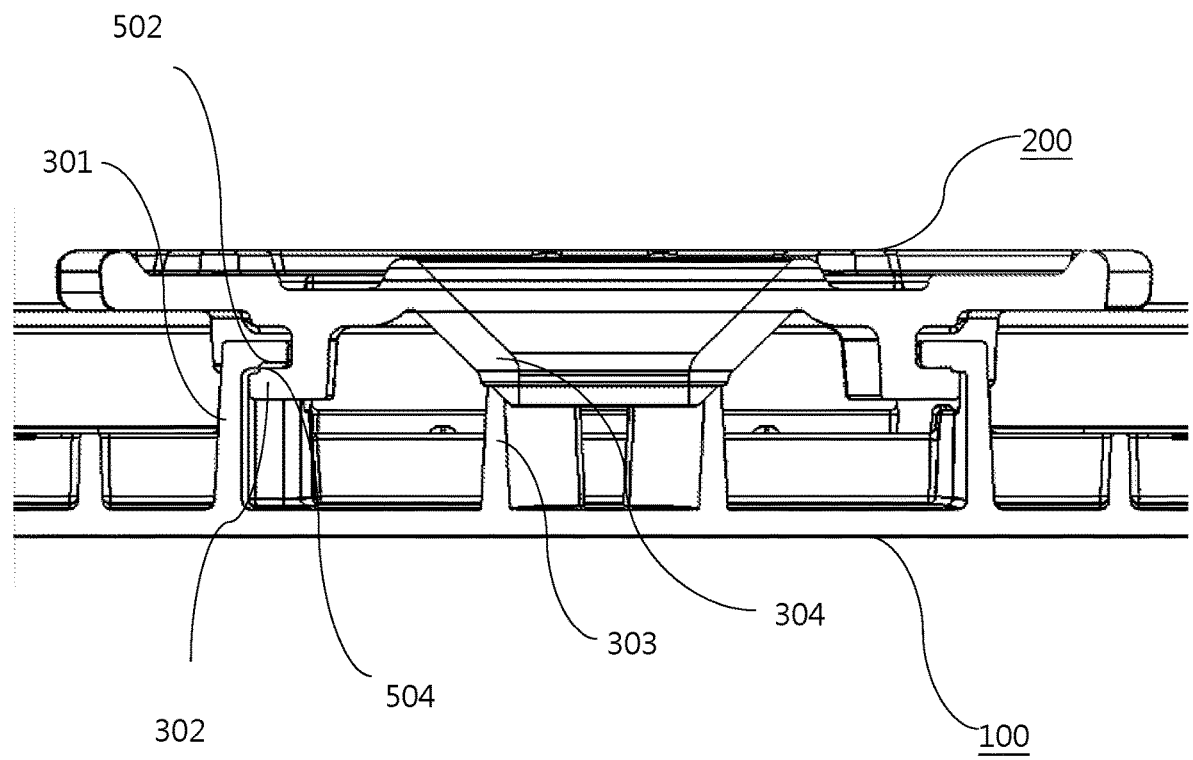
FIG. 3 illustrates a sectional view of the detachable module of the embodiment of the present invention.
Figure 4:
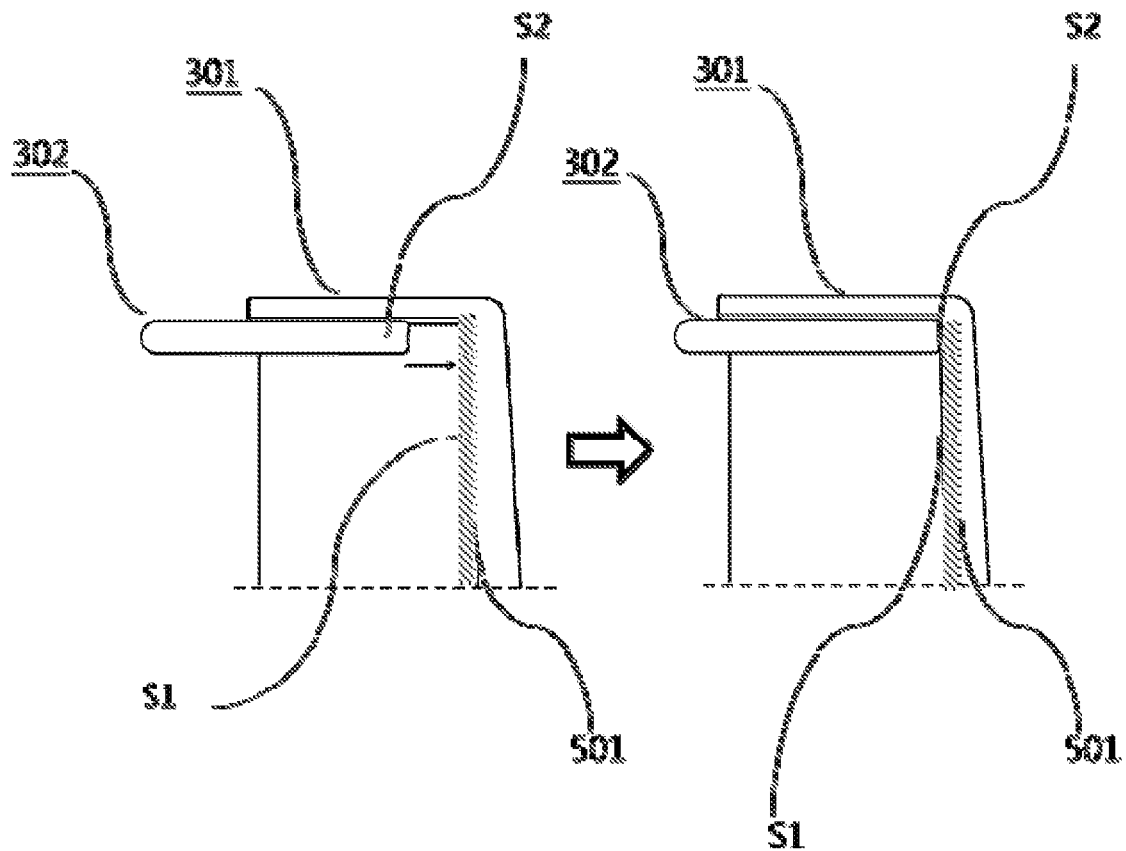
FIG. 4 shows a schematic diagram of the shield of the embodiment of the present invention.

Please refer to FIG. 3 and FIG. 4, FIG. 3 is a sectional view of the detachable module of the other embodiment of substrate carrier latching structure 10 in the present invention. FIG. 4 is a schematic diagram of the shield 501 of the embodiment of the present invention. As shown in FIG. 4, the first fasteners 301 further includes a shield 501, wherein the shield 501 holds the at least one second fastener 302 in a position to prevent the at least one second fastener 302 from rotating over a turning angle. In one of the embodiments, the turning angle ranges from 30 degrees to 120 degrees. In the other embodiment, the turning angle is defined by any ranges of angle that enable the first fastener 301 to mate appropriately with the second fastener 302, and it is not intended to be limited to the above forms.

In the embodiment, the shield 501 includes a first contact surface S1 which is shown in the cross-hatched portions of FIG. 4. Correspondingly, the second fastener 302 includes a second contact surface S2. Said second contact surface S2 is used to resist the first contact surface S1. Specifically, the area of the first contact surface S1 is big enough to block the second fastener 302 from moving along the direction of the arrow indicating as shown in FIG. 4. Thus, as indicated by the hollow arrow in FIG. 4, it is demonstrated that the shifting motion of the second contact surface S2 of the second fastener 302 toward the first contact surface S1 of the shield 501.

Please further refer to FIG. 3, in the other application in the present embodiment, the first fastener 301 further includes a first mating portion 502, and the second fastener 302 further includes a second mating portion 504. Besides, the second mating portion 504 is separable and is in concave-convex cooperation with the first mating portion 502 so as to form a fixed construction. Preferably, the fixed construction is a regular or irregular concave-convex structure, depending only on the design of tightness within the binding of the first mating portion 502 and the second mating portion 504, and it is not limited within the scope of the present invention.

Figure 5:
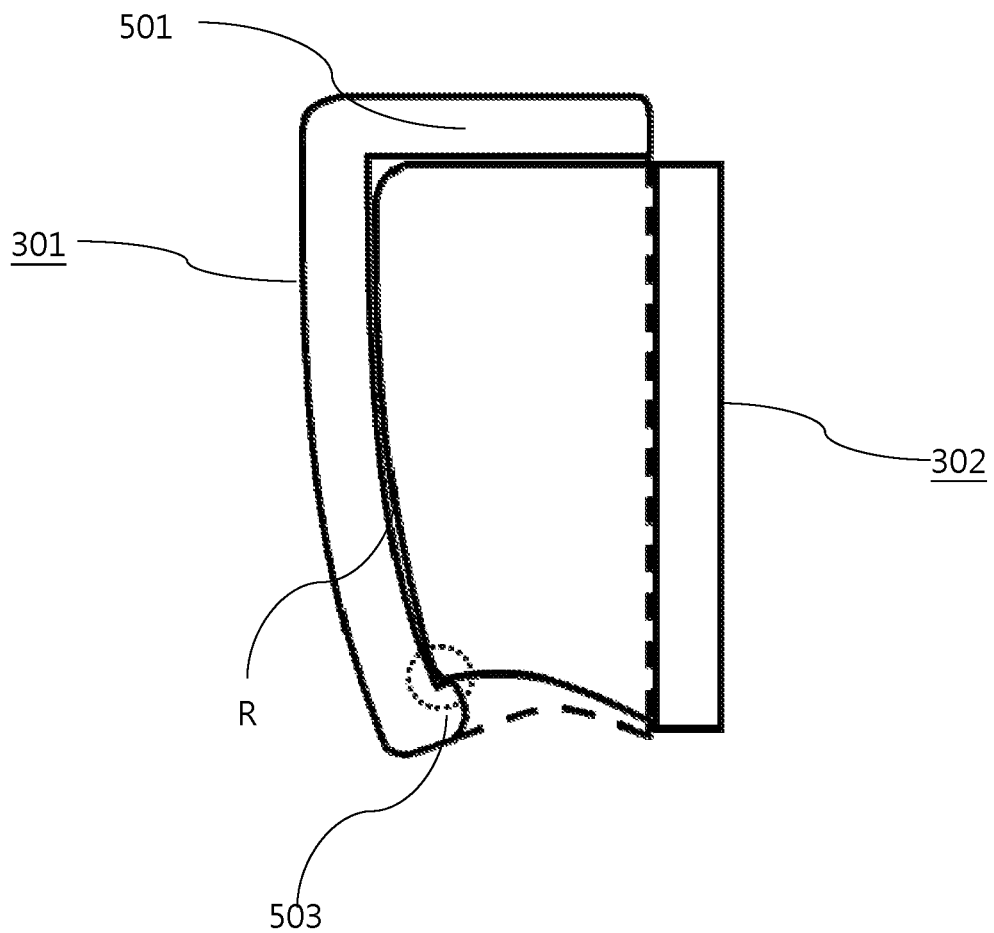
FIG. 5 illustrates a top sectional view of the stop portion of one embodiment of the present invention.

FIG. 5 is a top sectional view of the stop portion of one embodiment of the present invention. A shown in FIG. 5, in order to cooperate with the motion of the rotating installation, the second fastener 302 further includes an edge R. The edge R is designed as a curved surface so as to correspond tightly to a curvature of the first fastener 301. In the present embodiment, the degree of curvature of the edge R depends on the turning angle given by the shield 501 as discussed above. Otherwise, in the other embodiments, said degree of curvature of the edge R alternatively depends on the rotational motion parameters of the cover 200 per se, such as rotation angle, center of rotation, direction of rotation. Specifically, the curvature of the first fastener 301 is set to be equal to the curvature of the edge R so that the second fastener 302 slides to the shield 501 with the edge R to appropriately mate with the first fastener 301.

Furthermore, the first fastener 301 in the present embodiment alternatively includes a stop portion 503. In the practical application, the stop portion 503 is disposed on the first fastener 301 against the side of the shield 501 to prevent the second fastener 302 mating with the first fastener 301 from slipping on the first fastener 301 along the opposite direction of the small arrow as shown in FIG. 4. Preferably, the area of the contact surface between the stop portion 503 and the second fastener 302 is designed to enable users to separate the second fastener 302 from the first fastener 301 when appropriately applying force. Notably, the number of the stop portions 503 disposed simply depends on the applying force, and it is not limited within the scope of the present invention.

Please refer to FIG. 1 through FIG. 5 as the following to understand the operating method of the present invention. In the binding state, users adjust the position of the cover 200 aligning with the top portion 100 according to an alternative angle. In the meantime, match the first latch portion 505 with the second latch portion 506, and the first fastener 301 and the second fastener 302 are out of alignment. Then, apply the force on the cover and rotate the cover 200 according to the turning angle as discussed above so as to mate the second fastener 302 tightly with the first fastener 301 against the shield 501 (as shown in FIG. 4). Last, match the first latch portion 505 with the second latch portion 506 by several screwing members, such as screws and bolt, alternatively to tighten the combination between the cover 200 and the top portion 100. In addition, the term "mate tightly" represents that the second mating portion 504 is in concave-convex cooperation with the first mating portion 502 to acquire the state of tightly connecting between the first fastener 301 and the second fastener 302.

Please remain to refer to FIG. 1 through FIG. 5. In the separation state, first, users detach several screwing members and release the first latch portion 505 and the second latch portion 506. Then, unscrew the cover 200 in a reverse direction of installation which ends in the loose contact or even without contact of the second fastener 302 with the first fastener 301, to fully separate the cover 200 with the top portion 100. Therefore, under the implementation in FIG. 5, the second fastener 302 should first overcome the stop portion 503 and then rotate to release the first fastener 301. To be more specific, the term "fully separate" represents that users apply additional force to rotate and thus release the cover 200 to acquire the state of detaching the cover 200 from the top portion 100.

In the other embodiment of the present embodiment, the alignment member 304 further includes a first clinching portion (not shown in figures), and the positioning post 303 further includes a second clinching portion (not shown in figures). Wherein, the first clinching portion engages with the second clinching portion. As shown in FIG. 1 through FIG. 5, when the cover 200 is about to engage with the top portion 100, users first manage to align the cover 200 with the top portion 100. Then, apply the additional force to the cover 200 which brings the alignment member 304 together and accordingly engage the first clinching portion with the second clinching portion to effectively align and fix the alignment member 304 with the positioning post 303. Then, apply the additional force and rotate the cover 200 according to the turning angle as discuss above in order to connect the cover 200 onto the top portion 100. On the other hand, when the cover 200 is about to release from the top portion 100, apply an additional force to the cover 200 to separate the first fastener 301 from the second fastener 302, and thus the second fastener 302 and the first fastener 301 are out of alignment. Meanwhile or afterwards, users apply the force on the alignment member 304 in the axial direction and lift it up to detach the first clinching portion from the second clinching portion. Accordingly, the cover 200 is released from the top portion 100.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A substrate carrier latching structure, comprising: a top portion, disposed on an enclosure;
    a cover, connected to the top portion via a detachable module, wherein the detachable module disposed outside the enclosure and comprising:
    at least two first fasteners, configured on the top portion or the cover, wherein each of the at least two first fasteners includes a shield;
    at least two second fasteners, configured on the top portion or the cover corresponding to the each of the at least two first fasteners, wherein each of the at least two second fasteners is matched with the each of the at least two first fasteners;
    a positioning post, configured on the top portion or the cover; and
    an alignment member, configured on the top portion or the cover corresponding to the positioning post, wherein the alignment member matches with the positioning post; wherein the each of the at least two first fasteners further includes a stop portion, preventing the each of the at least two second fasteners from slipping on the each of the at least two first fasteners;
    wherein the alignment member is funnel shaped and is connected to a second surface of the cover through a biggest caliber of the alignment member, wherein the positioning post consists of two semicircle arcs which are not in contact with each other, wherein the cover is pressed downward and coupled to the top portion, so that the alignment member is inserted between the two semicircle arcs, and the cover is rotated so as to mate the at least two second fasteners tightly with the at least two first fasteners against the shield.

2. The substrate carrier latching structure as claimed in claim 1, wherein at least one first latch portion and at least one second latch portion are installed on the top portion and the cover respectively, and the at least one first latch portion and the at least one second latch portion are connected with the top portion and the cover respectively.

3. The substrate carrier latching structure as claimed in claim 2, wherein the at least one second latch portion matches with the at least one first latch portion.

4. The substrate carrier latching structure as claimed in claim 1, wherein the each of the at least two first fasteners is arranged in a ring-shape.

5. The substrate carrier latching structure as claimed in claim 1, wherein the shield holds the each of the at least two second fasteners in a position, preventing the each of the at least two second fasteners from rotating over a turning angle as the each of the at least two second fasteners matches with the each of the at least two first fasteners.

6. The substrate carrier latching structure as claimed in claim 1, wherein the each of the at least two first fasteners and the each of the at least two second fasteners further comprise a first mating portion and a second mating portion respectively, and the first mating portion engages with the second mating portion, forming a fixing structure.

7. The substrate carrier latching structure as claimed in claim 1, wherein the each of the at least two second fasteners further includes an edge, and the edge is a curved surface.

8. The substrate carrier latching structure as claimed in claim 7, wherein the cover rotatably engages with the top portion through the curved surface.

9. The substrate carrier latching structure as claimed in claim 5, wherein the each of the at least two second fasteners further includes an edge, and the edge is a curved surface.

10. The substrate carrier latching structure as claimed in claim 9, wherein the cover rotatably engages with the top portion through the curved surface.

11. The substrate carrier latching structure as claimed in claim 6, wherein the each of the at least two second fasteners further includes an edge, and the edge is a curved surface.

12. The substrate carrier latching structure as claimed in claim 11, wherein the cover rotatably engages with the top portion through the curved surface.

* * * * *